United States Patent
Suzuki et al.

[11] Patent Number: 5,945,693
[45] Date of Patent: *Aug. 31, 1999

[54] FIELD-EFFECT TRANSISTOR

[75] Inventors: Toshifumi Suzuki, Saitama-Ken; Yamato Ishikawa, Saitama-Ien, both of Japan

[73] Assignee: Honda Giken Kogyo Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/565,295

[22] Filed: Nov. 30, 1995

[30] Foreign Application Priority Data

Dec. 6, 1994 [JP] Japan ................................ 6-302343
Aug. 7, 1995 [JP] Japan ................................ 7-201148

[51] Int. Cl.⁶ ........................................ H01L 31/0328
[52] U.S. Cl. .......................... 257/192; 257/20; 257/24; 257/194
[58] Field of Search ................. 257/24, 192, 194, 257/20

[56] References Cited

U.S. PATENT DOCUMENTS 5,504,353  4/1996  Kuzuhara ........................ 257/194
5,514,883  5/1996  Nakatsuka et al. ............... 257/194

FOREIGN PATENT DOCUMENTS 1128473  5/1989  Japan.
114327   6/1989  Japan.

OTHER PUBLICATIONS

IEDM Technical Digest, Intern. Electroni Devices Meeting, Dec. 8, 1991, pp. 36.6.1–36.6.4.
IEEE 1995 Microwave & Millimeter–Wave Monolithic Circuits Symposium, "A W–band Single–Chip Transceiver for FMCW Radar" K. W. Chang et al., pp. 41–44, 1995.
IEEE 1993 Microwave & Millimeter–Wave Monolighic Circuits Symposium, "A Low Cost 77GHz Monolithic Transitter for Automotive Collission Vaoicance Systems," L. Raffaelli et al, pp. 63–66, 1993.

*Primary Examiner*—Minh Loan Tran
*Attorney, Agent, or Firm*—Lyon & Lyon LLP

[57] ABSTRACT

A field-effect transistor has a channel layer of InGaAs, and a pair of wide bandgap layers disposed one on each side of the channel layer, with respective heterojunctions formed with the channel layer. The channel layer has a thickness ranging from 50 to 150 angstroms, which is substantially the same as two-dimensional electron gas layers that are formed in the channel layer. The wide bandgap layers have the same composition, and the same concentration of an impurity.

8 Claims, 2 Drawing Sheets

FIELD-EFFECT TRANSISTOR

BACKGROUND OF THE INVENTION

1. Field of the Invention:

The present invention relates to a field-effect transistor having a double-heterojunction structure, and more particularly to a field-effect transistor with improved transconductance.

2. Description of the Prior Art:

One known field-effect transistor having a double-heterojunction structure includes a channel layer of indium gallium arsenide (InGaAs) having a thickness ranging from 100 to 200 angstroms, and a pair of wide bandgap layers (electron supply layers) of aluminum gallium arsenide (AlGaAs) which is disposed one on each side of the channel layer. Such a conventional field-effect transistor is disclosed in Japanese laid-open patent publications Nos. 1-128473 and 1-143271, for example.

FIG. 1 of the accompanying drawings shows drain voltage vs. drain current characteristics of such a conventional field-effect transistor at various gate voltages used as a parameter. A study of FIG. 1 indicates that the transconductance $g_m$ of the conventional field-effect transistor is not uniform.

To solve the above problem, it has been proposed to make the concentration of the dopant or impurity introduced into one of the wide bandgap layers greater than the concentration of the dopant introduced into the other wide bandgap layer, or to make the bandgap of one of the wide bandgap layers greater than the bandgap of the other wide bandgap layer, for thereby uniformizing the transconductance $g_m$.

However, the proposed solutions, which are based on individual adjustments of the dopant concentrations and the bandgaps, are unable to both increase and uniformize the transconductance $g_m$ because an attempt to uniformize the transconductance $g_m$ results in a reduction in the transconductance $g_m$.

SUMMARY OF THE INVENTION

It is therefore an object of the present invention to provide a field-effect transistor whose transconductance is relatively high and uniform in a wide range of gate voltages.

According to the present invention, there is provided a field-effect transistor comprising a channel layer of InGaAs, and a pair of wide bandgap layers disposed one on each side of the channel layer, with respective heterojunctions formed with the channel layer, the channel layer having such a thickness that two-dimensional electron gas layers produced in the channel layer are regarded as a substantially single two-dimensional electron gas layer, the wide bandgap layers having the same concentration of a impurity. The wide bandgap layers may have the same composition. Each of the wide bandgap layers may be made of $Al_xGa_{1-x}As$ (0.2<X<0.3). The thickness of the channel layer may range from 50 to 150 angstroms.

The wide bandgap layers contain respective planar doped layers spaced from the respective heterojunctions between the channel layer and the semiconductor layers, with respective undoped spacer layers of the same thickness interposed between the heterojunctions and the planar doped layers. The planar doped layers may have the same concentration of a dopant.

Alternatively, the wide bandgap layers may contain respective planar doped layers spaced substantially the same distance from the respective heterojunctions between the channel layer and the semiconductor layers.

According to the present invention, there is also provided a field-effect transistor comprising a channel layer of InGaAs, and a pair of wide bandgap layers of $Al_xGa_{1-x}As$ (0.2<X<0.3) disposed one on each side of the channel layer, with respective heterojunctions formed with the channel layer, each of the wide bandgap layers containing an impurity, the wide bandgap layers having the same composition ratios, the impurities of the wide bandgap layers having the same concentration. The impurity comprises silicon and the concentration may range from 1 to $10 \times 10^{12}$ cm$^2$.

Since the channel layer has a thickness ranging from 50 to 150 angstroms, which is substantially the same as two-dimensional electron gas layers that are formed in the channel layer, the two-dimensional electron gas layers can be regarded as a substantially single two-dimensional electron gas layer. The field-effect transistor has its transconductance kept high and uniform in a wide range of gate voltages without having to adjusting the composition and dopant or impurity concentration in the wide bandgap layers.

With the channel layer of InGaAs being of a very small thickness ranging from 50 to 150 angstroms and the symmetrical planar doped layers being formed one on each side of the channel layer by planar doping, the field-effect transistor has a high transconductance and also has uniform inductance characteristics with respect the gate voltage.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

Figure 1:
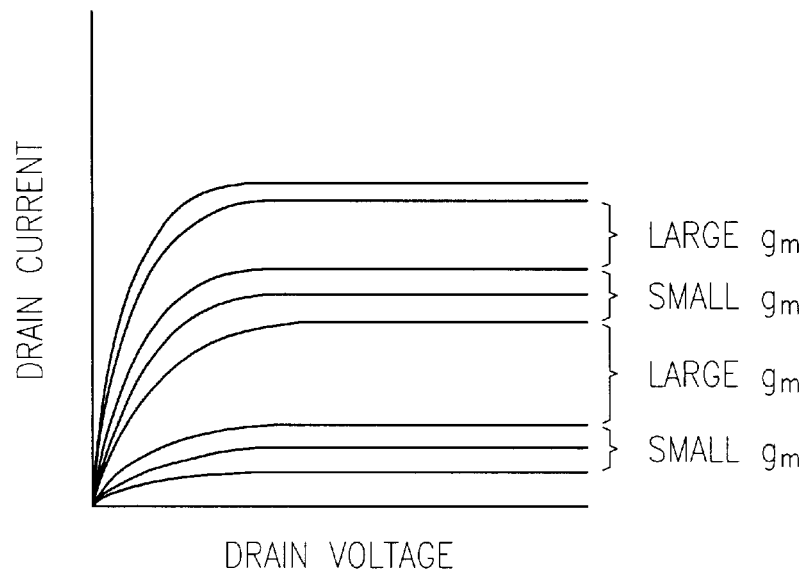
FIG. 1 is graph showing drain voltage vs. drain current charactstics of such a conventional field-effect transistor at various gate voltages.
Figure 2:
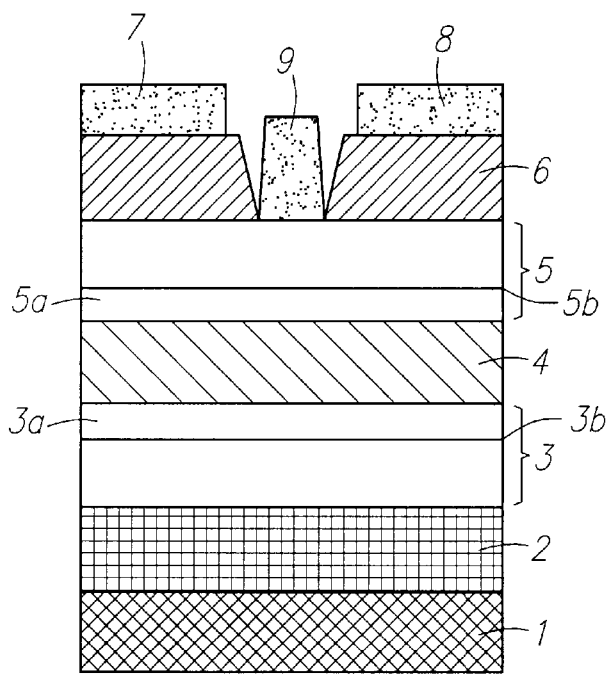
FIG. 2 is a cross-sectional view of a field-effect transistor according to the present invention.

As shown in FIG. 2, a field-effect transistor FET according to the present invention comprises a semi-insulative GaAs substrate 1, a superlattice buffer layer 2 deposited on the semi-insulative GaAs substrate 1, a double-heterojunction structure composed of layers 3, 4, 5 deposited on the superlattice buffer layer 2, an N+ contact layer 6 deposited on the double-heterojunction structure, source and drain electrodes 7, 8 deposited on the N+ contact layer 6, and a gate electrode 9 deposited on the double-heterojunction structure.

The superlattice buffer layer 2 is disposed on the semi-insulative GaAs substrate 1 for preventing unwanted carriers from leaking into the semi-insulative GaAs substrate 1. The layers 3, 4, 5 of the double-heterojunction structure are successively arranged in the order named from the superlattice buffer layer 2 toward the N+ contact layer 6.

The layer 3, which is disposed on the superlattice buffer layer 2, comprises a wide bandgap layer of $Al_xGa_{1-x}As$ (0.2<X<0.3) having a suitable thickness. The wide bandgap layer 3 contains therein a planar silicon-doped layer 3b which is produced by planar doping and spaced a given distance from the interface or heterojunction between the wide bandgap layer 3 and the layer 4, with a spacer layer 3a interposed between the layer 4 and the silicon-doped layer 3b. The thickness of layer 3 is less than 5000 angstroms. The spacer layer 3a has a thickness of less than 40 angstroms, and hence the silicon-doped layer 3b is spaced from the layer 4 about 40 angstroms. The spacer layer 3a is made of $Al_xGa_{1-x}As$ (0.2<X<0.3). The silicon-doped layer 3b is produced by doping an impurity or dopant of silicon at a concentration ranging from 1 to $10 \times 10^{12}$ $cm^2$.

The layer 4, which is disposed on the spacer layer 3a, serves as the channel of the field-effect transistor FET. The channel layer 4 is made of InGaAs and has a thickness ranging from 50 to 150 angstroms. This thickness of the channel layer 4 is small enough to form two two-dimensional electron gas channels or layers, which will be produced in the channel layer 4 by the double-heterojunction structure, as a single two-dimensional electron gas channel or layer without being separated from each other, irrespective of whether a voltage will be applied to the gate electrode 9 or not.

The layer 5, which is disposed on the channel layer 4 and provides a heterojunction therewith, comprises a wide bandgap layer of $Al_xGa_{1-x}As$ (0.2<X 0.3) having a thickness ranging from 250 to 350 angstroms which is small enough to allow a depletion layer from the gate electrode 9 to affect the channel layer 4. The wide bandgap layer 5 contains therein a planar silicon-doped layer 5b which is produced by planar doping and spaced a given distance from the interface or heterojunction between the wide bandgap layer 5 and the channel layer 4, with a spacer layer 5a interposed between the channel layer 4 and the silicon-doped layer 5b. The spacer layer 5a has a thickness of about 40 angstroms, and hence the silicon-doped layer 5b is spaced from the channel layer 4 by about 40 angstroms. The spacer layer 5a is made of $Al_xGa_{1-x}As$ (0.2<X<0.3). The silicon-doped layer 5b is produced by doping an impurity or dopant of silicon at a concentration ranging from 1 to $10 \times 10^{12}$ $cm^2$.

The composition ratios of $Al_xGa_{1-x}As$ of the wide bandgaps 3, 5 are equal to each other. The silicon-doped layers 3b, 5b may be formed at the heterojunctions, respectively, between the channel layer 4 and the wide bandgap layers 3, 5 with the spacer layers 3a, 5a being dispensed with.

Since the double-heterojunction structure is symmetric with respect to the central channel layer 4 and the channel layer 4 has a thickness ranging from 50 to 150 angstroms, the field-effect transistor has its transconductance $g_m$ whose rate of change is uniform at the time the gate voltage applied to the gate electrode 9 of the field-effect transistor FET is varied.

The N+ contact layer 6 is formed on the wide bandgap layer 5 of $Al_xGa_{1-x}As$ for easier ohmic contact with the source and drain electrodes 7, 8, and then the source and drain electrodes 7, 8 are formed on the N+ contact layer 6. Therefore, the source and drain electrodes 7, 8 are well electrically connected to the wide bandgap layer 5. It is preferable that the lower end of the gate electrode 9 be spaced from the N+ contact layer 6 by a very small bandgap of 0.1 $\mu$m or less.

Figure 3:
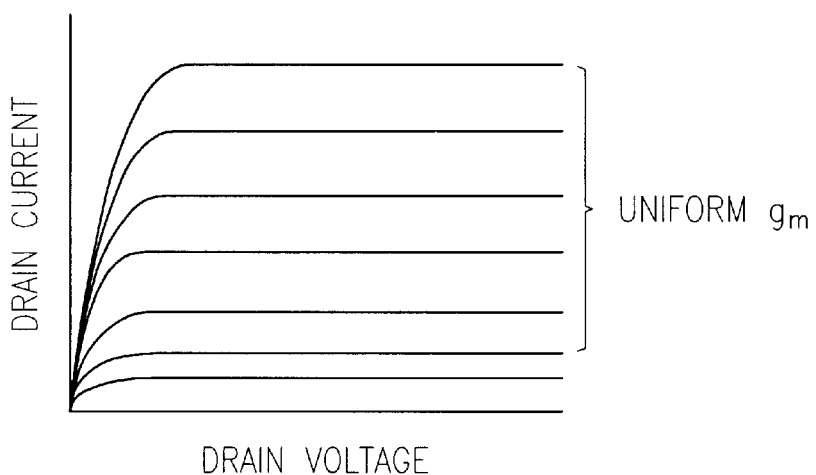
FIG. 3 is graph showing drain voltage vs. drain current characteristics of the field-effect transistor according to the present invention.

FIG. 3 shows drain voltage vs. drain current characteristics of the field-effect transistor FET according to the present invention at various gate voltages as a parameter. It can be seen from FIG. 3 that when the gate voltage is varied by constant values, the rate of change of the drain current remains uniform and hence the transconductance $g_m$ also remains uniform.

Figure 4:
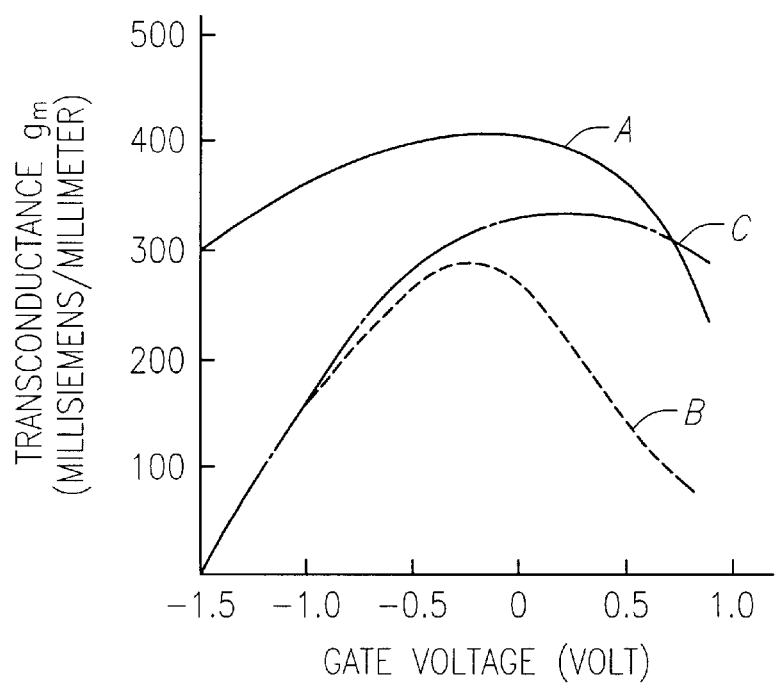
FIG. 4 is a graph showing transconductance vs. gate voltage characteristics of various field-effect transistors.

FIG. 4 shows transconductance vs. gate voltage characteristics of various field-effect transistors. The graph of FIG. 4 has a vertical axis representative of the transconductance $g_m$ per unit gate width and a horizontal axis of the gate voltage. The solid-line curve A indicates the transconductance $g_m$, plotted against the gate voltage, of the field-effect transistor according to the present invention. The dotted-line curve B indicates the transconductance $g_m$, plotted against the gate voltage, of a conventional field-effect transistor. The dot-and-dash-line curve C indicates the transconductance $g_m$, plotted against the gate voltage, of an improved conventional field-effect transistor in which the dopant or impurity concentration and bandgap of an upper wide bandgap layer (corresponding to the wide gap layer 5 shown in FIG. 2) are greater than those of a lower wide bandgap layer (corresponding to the wide bandgap layer 3 shown in FIG. 2). A review of FIG. 4 clearly indicates that the transconductance $g_m$ of the field-effect transistor according to the present invention is greater than that of the conventional field-effect transistors.

The field-effect transistor according to the present invention has its InGaAs channel layer 4 as thick (50~150 angstroms) as two-dimensional electron gas layers. Therefore, the two two-dimensional electron gas layers, which are produced in the channel layer 4 by the double-heterojunction structure, have the same carrier density, and are formed closely to each other with the same electron density, so that they can be regarded as a substantially single two-dimensional electron gas layer. The symmetrical wide bandgap layers 3, 5, one on each side of the channel layer 4, and the same dopant or impurity concentration in the wide bandgap layers 3, 5 make it possible to uniformize the transconductance of the field-effect transistor in a wide range of gate voltages.

Inasmuch as the wide bandgap layers 3, 5 have the same dopant concentration and the same composition, the management of the conditions for fabricating the field-effect transistor is facilitated, and as a result field-effect transistors can be fabricated with an increased yield and a reduced variation of characteristics.

The channel layer 4 of InGaAs is of a very small thickness ranging from 50 to 150 angstroms and the symmetrical doped layers 3b, 5b are formed one on each side of the channel layer 4 by planar doping. The field-effect transistor, therefore, has a high transconductance with the single channel of high carrier density, and also has uniform inductance characteristics with respect the gate voltage.

Although a certain preferred embodiment of the present invention has been shown and described in detail, it should be understood that various changes and modifications may be made therein without departing from the scope of the appended claims.

What is claimed is:

1. A field-effect transistor comprising:

a channel layer of InGaAs; and a pair of semiconductor layers having respective wide bandgaps disposed one on each side of said channel layer, with respective heterojunctions formed with said channel layer;

said channel layer having such a thickness that two-dimensional electron gas layers produced in the channel layer are regarded as a substantially single two-dimensional electron gas layer;

said wide bandgap layers containing respective planar doped layers therein spaced from the respective heterojunctions between said channel layer and said semiconductor layer, and respective undoped spacer layers of the same thickness interposed between said heterojunctions and said planar doped layers.

2. A field-effect transistor according to claim 1, wherein said planar doped layers have the same concentration of a dopant.

3. A field-effect transistor comprising:

a channel layer of InGaAs; and a pair of wide bandgap layers disposed one on each side of said channel layer, with respective heterojunctions formed with said channel layers;

said wide bandgap layers containing respective planar doped layers therein spaced substantially the same distance from the respective heterojunctions between said channel layer and said wide bandgap layers.

4. A field-effect transistor comprising:

a channel layer of InGaAs; and a pair of wide bandgap layers of $Al_xGa_{1-x}As$ (0.2<x<0.3) disposed one on each side of said channel layer, with respective heterojunctions formed with said channel layer, each of said wide bandgap layers containing an impurity;

said wide bandgap layers having the same composition ratios, the impurities of said wide bandgap layers having the same concentration, and wherein said wide bandgap layers comprise a silicon-doped layer therein having a concentration ranging from 1 to $10 \times 10^{12}$ cm$^2$.

5. A field-effect transistor comprising:

a channel layer of InGaAs;

a pair of undoped wide bandgap layers disposed one on each side of said channel layer, with respective heterojunctions formed with said channel layer;

said channel layer having such a thickness that two-dimensional electron gas layers produced in the channel layer are regarded as a substantially single two-dimensional electronic gas layer; and a pair of planar doped layers disposed one on each side of said undoped wide bandgap layer.

6. A field-effect transistor according to claim 5 wherein said wide bandgap layer is made of AlGaAs.

7. A field-effect transistor according to claim 5 wherein a pair of undoped wide bandgap layers have substantially the same thickness.

8. A field-effect transistor according to claim 5 wherein a pair of undoped wide bandgap layers have the same composition.

* * * * *